(12) United States Patent
Chen et al.

(10) Patent No.: US 9,058,158 B2
(45) Date of Patent: Jun. 16, 2015

(54) ELECTRONIC DEVICE

(71) Applicants: Inventec (Pudong) Technology Corporation, Shanghai (CN); INVENTEC CORPORATION, Taipei (TW)

(72) Inventors: Jing Chen, Shanghai (CN); Chien-Lung Chen, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 367 days.

(21) Appl. No.: 13/775,267

(22) Filed: Feb. 25, 2013

(65) Prior Publication Data

US 2014/0133087 A1 May 15, 2014

(30) Foreign Application Priority Data

Nov. 12, 2012 (CN) .......................... 2012 1 0451093

(51) Int. Cl.
H05K 5/00 (2006.01)
H05K 7/20 (2006.01)
G06F 1/20 (2006.01)

(52) U.S. Cl.
CPC .............. *G06F 1/20* (2013.01); *H05K 7/20727* (2013.01)

(58) Field of Classification Search
CPC ....... G06F 1/20; G06F 1/203; H05K 7/20136; H05K 7/20172; H05K 7/20181; H05K 7/20145

USPC ............ 361/679.46, 679.47, 679.48, 679.49, 361/679.5, 679.51
See application file for complete search history.

(56) References Cited

U.S. PATENT DOCUMENTS

| | | | | |
|---|---|---|---|---|
| 6,005,770 A | * | 12/1999 | Schmitt | ......................... 361/695 |
| 6,042,348 A | * | 3/2000 | Aakalu et al. | .............. 417/423.5 |
| 6,936,767 B2 | * | 8/2005 | Kleinecke et al. | .............. 174/50 |
| 7,128,526 B2 | * | 10/2006 | Paulsen | ......................... 415/146 |
| 7,535,709 B2 | * | 5/2009 | Fan et al. | ...................... 361/695 |
| 8,587,940 B2 | * | 11/2013 | Lai | .......................... 361/679.33 |
| 2003/0002253 A1 | * | 1/2003 | Hillyard et al. | ............... 361/687 |
| 2006/0087813 A1 | * | 4/2006 | Becker et al. | ................. 361/694 |
| 2007/0004327 A1 | * | 1/2007 | Tao et al. | ...................... 454/184 |
| 2008/0218969 A1 | * | 9/2008 | Muraki | ......................... 361/695 |

FOREIGN PATENT DOCUMENTS

| | | |
|---|---|---|
| CN | 201527617 U | 7/2010 |
| CN | 102279633 A | 12/2011 |
| TW | M374087 U | 2/2010 |

\* cited by examiner

*Primary Examiner* — Anthony Haughton
(74) *Attorney, Agent, or Firm* — CKC & Partners Co., Ltd.

(57) ABSTRACT

An electronic device includes a motherboard, a power module, a hard disk module, a fan module, a heating module and a power-supply wind scooper. The power module is arranged on a front side of the motherboard along a longitudinal direction, and has a power-supply opening. The hard disk module is stacked on the module. The fan module is located on a rear side of the motherboard along a transverse direction, and further provides airflows towards the power-supply opening of the power module. The heating module is arranged on the motherboard, and further located between the fan module and the power module. The power-supply wind scooper shields a part of the power-supply opening, so as to respectively guide parts of the airflow into the power module and the heating module.

18 Claims, 4 Drawing Sheets

ELECTRONIC DEVICE

RELATED APPLICATIONS

This application claims priority to China Application Serial Number 201210451093.0, filed Nov. 12, 2012, which is herein incorporated by reference.

BACKGROUND

1. Technical Field

The present disclosure relates to are electronic device, and more particularly relates to a server.

2. Description of Related Art

In recent years, with the rapid develops science and technology, the operation speed of an electronic device is being constantly increased. Additionally, with the efficiency improvement of the electronic device, the heating power of electronic parts of the electronic device is also constantly increased. In order to prevent the temporary or permanent failure of the electronic parts due to overheat, the electronic lid device should provide the electronic parts with sufficient heat dissipation efficiency. Therefore, for the electron parts with high heating power (such as a central processing unit or graphics hip and the like), generally heat dissipation modules such as heat dissipation fins are additionally arranged to decrease the temperature of these electronic parts. Additionally, the electronic parts are generally located in an enclosure of the electronic device. In order to dissipate the heat absorbed by the heat dissipation modules fully out of the enclosure, the efficiency of heat convection in the enclosure is also one of problems worthy of attention.

For a sever, the server should have enough stability and reliability to prevent the service provided thereby from being interrupted. Therefore, a flow guiding structure with an auxiliary heat dissipation function is often arranged in the enclosure of the server to increase the efficiency of heat convection. For example, fans may be arranged on one side of a motherboard in the server, and moreover, a power-supply wind scooper is arranged at an opening of a power module so that the airflow blown out from the fans can flow into the power module as guided by the power-supply wind scooper, so that the heat generated by the power module is dissipated out of the enclosure. As a result, the temperature of the server is decreased and the operation thereof is stabilized.

However, the configuration of the wind scooper affects the heat dissipation efficiency of the wind scooper. That is, after flowing through electronic parts which generates heat, the temperature of the airflow rises as carrying the heat generated by the electronic parts. At this moment, the same airflow fails to continue to cool other electronic parts. Therefore, poor heat dissipation efficiency of the electronic device is easily caused.

SUMMARY

The present disclosure provides an electronic device, having good heat dissipation efficiency.

The present disclosure provides an electronic device, including a motherboard, a power module, a hard disk module, a fan module, a heating module and a power-supply wind scooper. The power module is arranged on a front side of the motherboard along a longitudinal direction, and has a power-supply opening. The hard disk module is arranged on the front side of the motherboard along the longitudinal direction and further stacked on the power module. The fan module is located on a rear side of the motherboard relative to the front side along a transverse direction perpendicular to the longitudinal direction, and further provides airflow towards the power-supply opening of the power module. The heating module is arranged on the motherboard and further located between the fan module and the power module. The power-supply wind scooper is arranged to shield a part of the power-supply opening, so that a first airflow flowing through the heating modules is prevented by the power-supply wind scooper from flowing into the power module, and a second airflow not flowing through the heating modules flows into the power module from a part of the power-supply opening not shielded by the power-supply wind scooper.

In an embodiment of the present disclosure, the power-supply wind scooper mentioned above has an air inlet, which is located on one side of the power-supply wind scooper and further corresponds to a part of the power supply opening not shielded by the power-supply wind scooper, so that a third airflow not flowing through the heating module passes through the air inlet to enter the space between the power-supply wind scooper and the part of the power-supply opening shielded by the power-supply wind scooper and further passes through the part of the power-supply opening shielded by the power-supply wind scooper to flow into the power module.

The power-supply wind scooper is arranged on the motherboard and facing the power-supply opening, and the air inlet is arranged to face lateral side of the electronic device and be adjacent to the part of the power-supply opening not shielded by the power-supply wind scooper.

In an embodiment of the present disclosure, the power-supply wind scooper mentioned above has a stopping part, which is located on a second side of the power-supply wind scooper opposite to the one side of the power-supply wind scooper and being perpendicular to the transverse direction, so that the first airflow flowing through the heating module is prevented from spreading from the second side of the power-supply wind scooper.

In an embodiment of the present disclosure, the electronic device mentioned above further includes a power line, which connects the motherboard and the power module. The power-supply wind scooper is provided with an internal face facing the power-supply opening and an external face facing the fan module. The power line is arrange on the external face of the power-supply wind scooper.

In an embodiment of the present disclosure, the power-supply wind scooper mentioned above has a line arrangement hook, which is located on the external face of the power-supply wind scooper. The power in is fixed on the power-supply kind scooper by the arrangement hook.

In an embodiment of the present disclosure, the electronic device mentioned above further includes a hard disk wind scooper attached to the hard disk module for preventing first airflow flowing through the heating module from flowing into the hard disk module.

In are embodiment of the present disclosure, the electronic device mentioned above further includes a hard disk wind scooper, and the hard disk module has a hard disk opening arranged towards the fan module. The hard disk wind scooper is attached to the hard disk module and is rotatable between a first position and a second position. When the hard disk wind scooper is at the first position, the hard disk wind scooper shields the hard disk opening. When the hard disk wind scooper is at the second position, the power-supply wind scooper is between the hard disk wind scooper and the motherboard so that the first airflow flowing through the heating module is prevented by the hard disk wind scooper from spreading upwardly to enter the hard disk module.

When the hard disk wind scooper is at the second position, the hard disk wind scooper exposes the hard disk opening to the fan module so that a fourth airflow not flowing through the heating module flows along a top face of the hard disk wind scooper to enter the hard disk module through the hard disk opening.

In addition, when the hard disk wind scooper is at the second position, the hard disk wind scooper parallel the motherboard.

When the hard disk wind scooper is at the second position, the hard disk wind scooper shields a part of the heating module.

In an embodiment of the present disclosure, the hard disk wind scooper has a fixing hook. The power-supply wind scooper has a fixing hole located on the top part of the power supply wind scooper. When the hard disk wind scooper is at the second position, the hard disk wind scooper is fixed onto the power-supply wind scooper by fastening the fixing hook into the fixing hole.

In an embodiment of the present disclosure, the hard disk module mentioned above includes a hard disk bracket and a plurality of hard disks. The hard disks are arranged side by side or laminated in the hard disk bracket. The hard disk wind scooper is arranged on the hard disk bracket to shield or expose the hard disk opening located on the hard disk bracket.

In an embodiment of the present disclosure, the electronic device mentioned above further includes a fan wind scooper. The fan wind scooper is covered on the heating modules and further has a partition board extending to the power module from the fan module, so that the first airflow flows through the heating modules by flowing between the partition board and the motherboard, a fourth airflow flows to the hard disk module by flowing above the partition board, without flowing through the heating module.

In an embodiment of the present disclosure, the fan wind scooper mentioned above includes an air inlet and a plurality of air outlets. The air inlet corresponds to the fan module. The heating module corresponds to one of the air outlets. Therefore, the first airflow can flow towards the power module through the heating module via the one of the air outlets from the air inlet.

In an embodiment of the present disclosure, the electronic device mentioned above further includes a gap layer between the power module and the hard disk module, and the first airflow flowing through the heating module flows out of the electronic device via the gap layer.

In an embodiment of the present disclosure, the electronic device mentioned above further includes a hard disk wind scooper attached to the hard disk module for preventing the first airflow flowing through the heating module from flowing into the hard disk module. The first airflow flowing through the heating module flows into the gap layer via a gap between the hard disk wind scooper and the power-supply wind scooper.

In an embodiment of the present disclosure the electronic device mentioned above further includes a case, and the mother board is arranged in the case. The case has a lateral wall adjacent the wind scooper and the power module. The second airflow not flowing through the heating module flows to the part of the power-supply opening not shielded by the power-supply wind scooper along a gap between the lateral wall and the wind scooper.

In view of the above, the present disclosure provides an electronic device. The power-supply wind scooper is arranged on the power module and shields a part of the power-supply opening, so that a part of the airflow flowing through the heating module prevented from flowing into the power module, and a part of the airflow not flowing through the heating module flows into the power module from the part of power-supply opening not shielded by the power-supply wind scooper so as to decrease the temperature. Therefore, the electronic device obtains good heat dissipation efficiency.

In order to make the features and advantages mentioned above of the present disclosure more apparent, specific embodiments are listed hereafter to make a detailed description with reference to the accompanying drawings.

DETAILED DESCRIPTION

Figure 1:
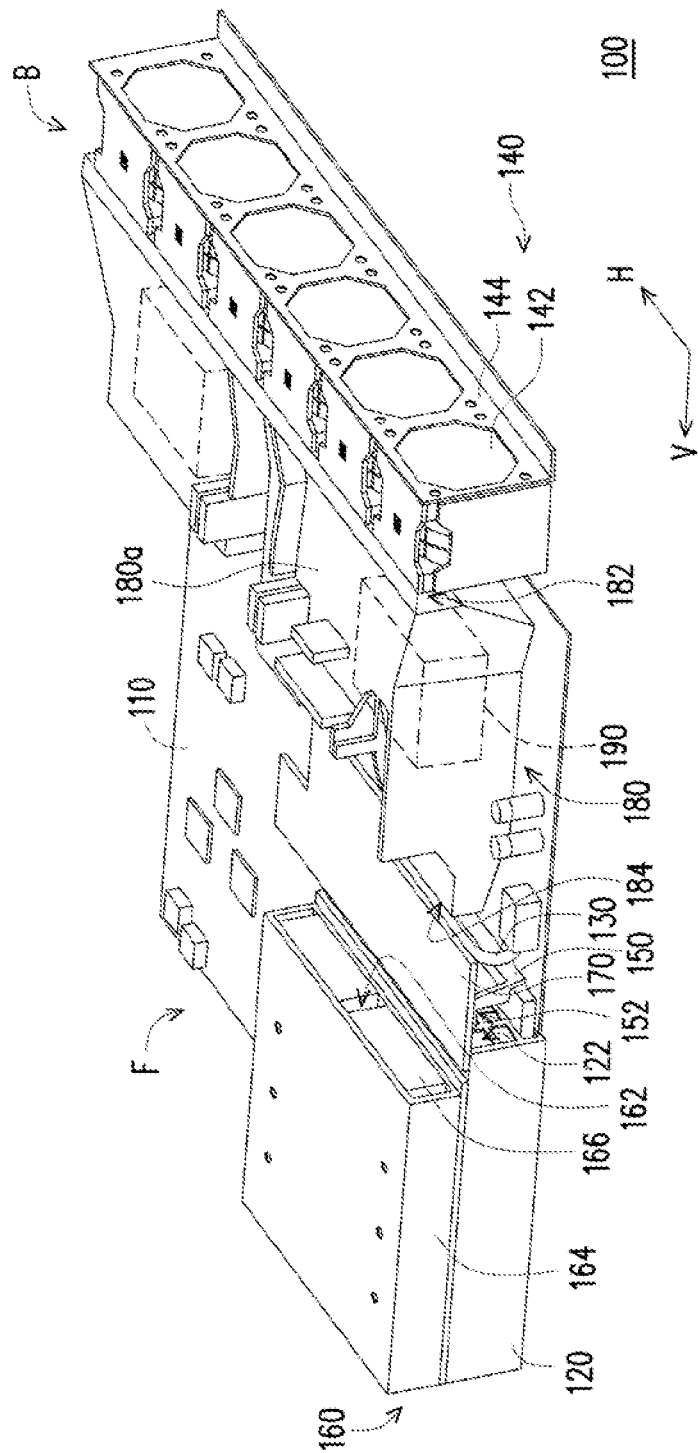
FIG. 1 is a schematic diagram of electronic device according to an embodiment of the present disclosure.

FIG. 1 is a schematic diagram of an electronic device according to an embodiment of the present disclosure. Referring to FIG. 1, in this embodiment, the electronic device 100 includes a motherboard 110, a power module 120, a power line 130, a fan module 140, a power-supply wind scooper 150, a hard c disk module 160, a hard disk wind scooper 170, a fan wind scooper 180 and a plurality of heating modules 190. The electronic device 100, for example, is a server, but the electronic device 100 is not limited in the present disclosure.

The power module 120 is arranged front side F of the motherboard 110 along the longitudinal direction V, and has a power-supply opening 122. The power line 130 connects the motherboard 110 and the power module 120. The hard disk module 160 is arrange on the front side F of the motherboard 110 along the longitudinal direction V and further stacked on the power module 120. The fan module 140 is located on a rear side B of the motherboard 110 relative to the front side F along the transverse direction H perpendicular to the longitudinal direction V, further provides airflow towards the power-supply opening 122 of the power module 120. In addition, the heating modules 190 are arranged on the motherboard 110 along the transverse direction H and located between the fan module 140 and the power module 120.

In this embodiment, the fan module 140 having six fans 142 placed in a fan bracket 144 is taken as an example, but the number of the fans 142 of the fan module 140 is not limited in the present disclosure. The fans 142 are arranged in one row along the transverse direction H in the fan bracket 144 and further faces the power module 120, the hard disk module 160 and the heating modules 190, so that the fans 142 can provide the airflow along the longitudinal direction V.

It can be seen that the module 140 provides the airflow via the fans 142. The airflow can flow in the interior of the electronic device 100 so that the heat generated by all the electronic parts of the electron device 100 during the operation process can be dissipated out of the electronic device 100 with flowing of the airflow. Therefore, by making the fan module 140 face the power-supply opening 122 of the power module 120, the hard disk module 160 and the heating modules 190, the airflow provided b the fan module 140 flows towards the power module 120, the hard disk module 160 and the heating module 190 so as to decrease the operation temperature thereof.

In this embodiment, the heating modules 190, for example, are electronic elements which generate a large amount of heat during the operation process, such central processing unit (CPU) or a memory module. Since the heating module 190 is located between the fan module 140 and the power module 120, a first airflow flowing towards the power module 120 from the fan module 140 flows through the heating modules 190 at first to carry away the heat generated by the heating modules 190. At this moment, the temperature of the first airflow rises. If the first airflow flows into the power module 120, the heat dissipation efficiency of the power module 120 is decreased.

Therefore, the power-supply wind scooper 150 is attached to the power module 120 and further shields a part of the power-supply opening 122. Thus the first airflow flowing through the heating modules 190 can be prevented from flowing into the power module 120. Moreover, a second airflow not flowing through the heating modules 190 is guided to flow into the power module 120 from a part of the power-supply opening 122 not shielded by the power-supply wind scooper 150. The electronic device 100 further includes a case (not shown). The motherboard 110 is arranged in the case; the case has a lateral wall adjacent to the wind scooper 180 and the power module 120; the second airflow not flowing through the heating module 90 flows to the part of the power-supply opening 122 not shielded by the power-supply wind scooper 150 along a gap between the lateral wall and the wind scooper 180.

Figure 2:
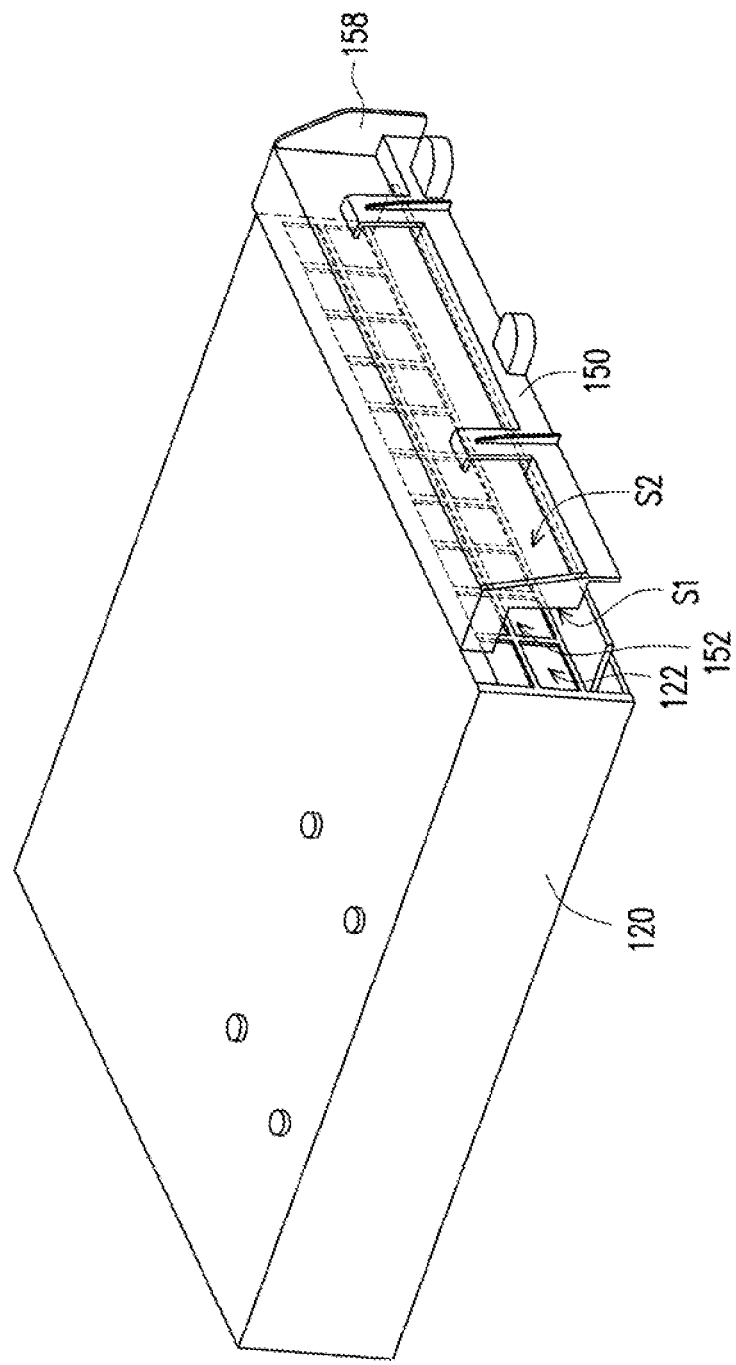
FIG. 2 is a schematic diagram of a power module and a power-supply wind scooper shown in FIG. 1.

FIG. 2 is a schematic diagram of a power module and a power-supply wind scooper shown in FIG. 1. Referring to FIGS. 1 and 2, in this embodiment, the power-supply wind scooper 150 has an air inlet 152. The air inlet 152 is located on one side of the power-supply wind scooper 150, and further corresponds to the part of the power-supply opening 122 not shielded by the power-supply wind scooper 150, so that a third airflow not flowing through the heating module 190 flows into the power module 120 from the air inlet 152. More specifically, the third airflow not flowing through the heating module 190 passes through the air inlet 152 to enter the space between the power-supply wind scooper 150 and the part of the power-supply opening 122 shielded by the power-supply wind scooper 150 and further passes through the part of the power-supply opening 122 shielded by the power-supply wind scooper 150 to flow into the power module 120. The third airflow not flowing through the heating module 190 flows to the air inlet 152 along the gap between the lateral wall and the wind scooper 180.

Additionally, in this embodiment, the power-supply wind scooper 150 further has a stopping part 158. The stopping part 158 is located on a second side of the power-supply wind scooper 150 opposite to the one side of the power-supply wind scooper 150 and is perpendicular to the transverse direction H, so that the first airflow flowing through the heating modules 190 is prevented from spreading from the second side of the power-supply wind scooper 150 to flow towards the plurality of electronic parts located on the motherboard 110 (as shown in FIG. 1. Therefore, the other electronic parts on the motherboard 110 can be cooled directly by airflow flowing out from the fan module 140, and are not affected by the airflow which has a risen temperature as carrying the heat generated by the heating modules 190.

Figure 3:
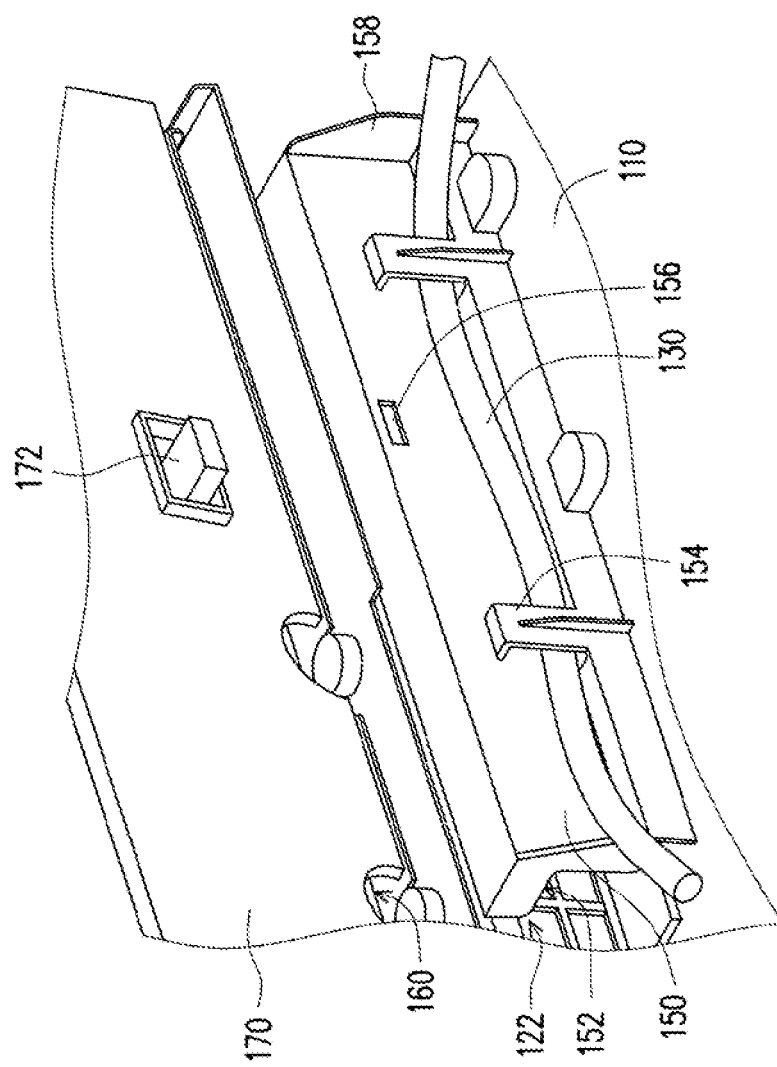
FIG. 3 is a partially-enlarged schematic view of the power-supply wind scooper shown in FIG. 1.

FIG. 3 is a partially-enlarged schematic view, of the power-supply wind scooper shown in FIG. 1. Referring to FIGS. 2 and 3, in this embodiment, the power-supply wind scooper 150 further has a line arrangement function. That is, the power-supply wind scooper 150 has a function of accommodating the power line 130, to prevent the power line 130 from interfering with the motherboard 110.

Particularly, this embodiment, the power-supply wind scooper 150 has an internal face S1 facing the power-supply opening 122 and an external face S2 facing the fan module 140. The power-supply wind scooper 150 has a line arrangement hook 154, which is located on the external face S2 of the power-supply wind scooper 150. Therefore, the power line 130 is fixed on the external face S2 of the power-supply wind scooper 150 by the line arrangement hook 154. A part of the airflow not flowing through the heating modules 190 flows into the power module 120 along the internal face S1 from the air inlet 152. In this way, the power line 110 can be prevented from being directly scattered on the motherboard 110 to interfere with the operation of other electronic parts on the motherboard 110. Also, additional space is left in the interior of the electronic device 100 for the configuration of other electronic parts. As such, it is not necessary to use additional wire damps to fix the power line 130 on the motherboard 110.

Additionally, referring to the FIG. 1 again, in this embodiment, the hard disk module 160 is stacked above the power module 120, and has a hard disk opening 162. The fan module 140 facing the power-supply opening 122 of the power module 120 also faces the hard disk opening 162 of the hard disk module 160. Therefore, the airflow provided by the fan module 140 can flow to the hard disk module 160, and further flow into the hard disk module 160 from the hard disk opening 162, so as to decrease the operation temperature of the hard disk module 160.

In this embodiment, the hard disk module 160 includes a hard disk bracket 164 and two hard disks 166. The hard disk opening 162 is actually formed by the hard disk bracket 164. The hard disks 166 are arranged side by side or laminated the hard disk bracket 164 and further exposed in the hard disk opening 162. In addition, the hard disk module 160 having two hard disks 166 is taken as an example in this embodiment. The hard disks 166, for example, are large-scale hard disks (LFF) or hard disks of other types, and the number and type of the hard disks are not limited the present disclosure.

Additional the hard disk wind scooper 170 is attached to the hard disk module 160, and further is capable of rotating relative to the hard disk module 160. The hard disk wind scooper 170 is used for preventing the first airflow flowing through the heating module 190 from flowing into the hard disk module 160. The hard disk wind scooper 170 is rotatable between a first position and a second position; when the hard disk wind scooper 170 is at the first position, the hard disk wind scooper 170 shields the hard disk opening 162; when the hard disk wind scooper 170 is at the second position, the power-supply wind scooper 150 is between the hard disk wind scooper 170 and the motherboard 110 so that the first airflow flowing through the heating module 190 is prevented by the hard disk wind scooper 170 from spreading upwards to enter hard disk module 160. The hard disk wind scooper 170 can be rotatably put down to the second position and rotatably put up to the first position. Therefore, when the hard disk wind scooper 170 is put down to shield a part of the heating modules 190 (e.g., the memory module) and expose the hard disk opening 162 (as the state shown in FIG. 1), the hard disk wind scooper 170 can be fixed on the power-supply wind scooper 150, so that the first airflow which is heated as flowing through the heating modules 190 is prevented from flowing into the hard disk module 160 upwardly, and the a fourth airflow not flowing through the heating modules 190 flows into the hard disk module 160. Additionally, the hard disk wind scooper 170 can rotate relative to the hard disk module 160 so as to expose the shielded heating modules 190.

Particularly, when the hard disk wind scooper 170 is put down to expose the hard disk opening 162, continuous connection faces are formed on the rear ends of the hard disk wind scooper 170 and the fan wind scooper 180. Therefore, when the airflow provided by the fan module 140 flows towards the hard disk module 160 from the upper part of the fan wind scooper 180, without flowing through the heating modules 190, the hard disk wind scooper 170 can guide the airflow to swimmingly flow to the hard disk module 160 and further flow into the hard disk opening 162 for heat dissipation.

In addition, when being put down to expose the hard disk opening 162, the hard disk wind scooper 170 can prevent the first airflow which is heated as flowing through the heating modules 190 and blocked by the power-supply wind scooper 150 from flowing upwardly into the hard disk module 160 to affect the heat dissipation efficiency of the hard disk module 160. The first airflow flowing through the heating modules 190 goes up along a inclined plane of the power-supply wind scooper 150, and further flows out of the electronic device 100 through a gap layer (not shown) between the power module 120 and the hard disk module 160. Moreover, the first airflow flowing through the heating nodule 190 flows into the gap layer via a gap (not shown) between the hard disk wind scooper 110 and the power-supply wind scooper 150.

Additionally, when the hard disk wind scooper 170 is put down to expose the hard disk opening 162, the hard disk wind scooper 170 shields a part of the heating modules 190, e.g., the memory module. Therefore, when it needs to operate these shielded heating modules 190 (for example, plugging a memory in and out), a user makes the shielded heating modules 190 be exposed by rotating the hard disk wind scooper 170 relative to the hard disk module 160, so as to providing enough room for performing relevant operations. As such, the power-supply wind scooper 150 can have good operability.

Figure 4:
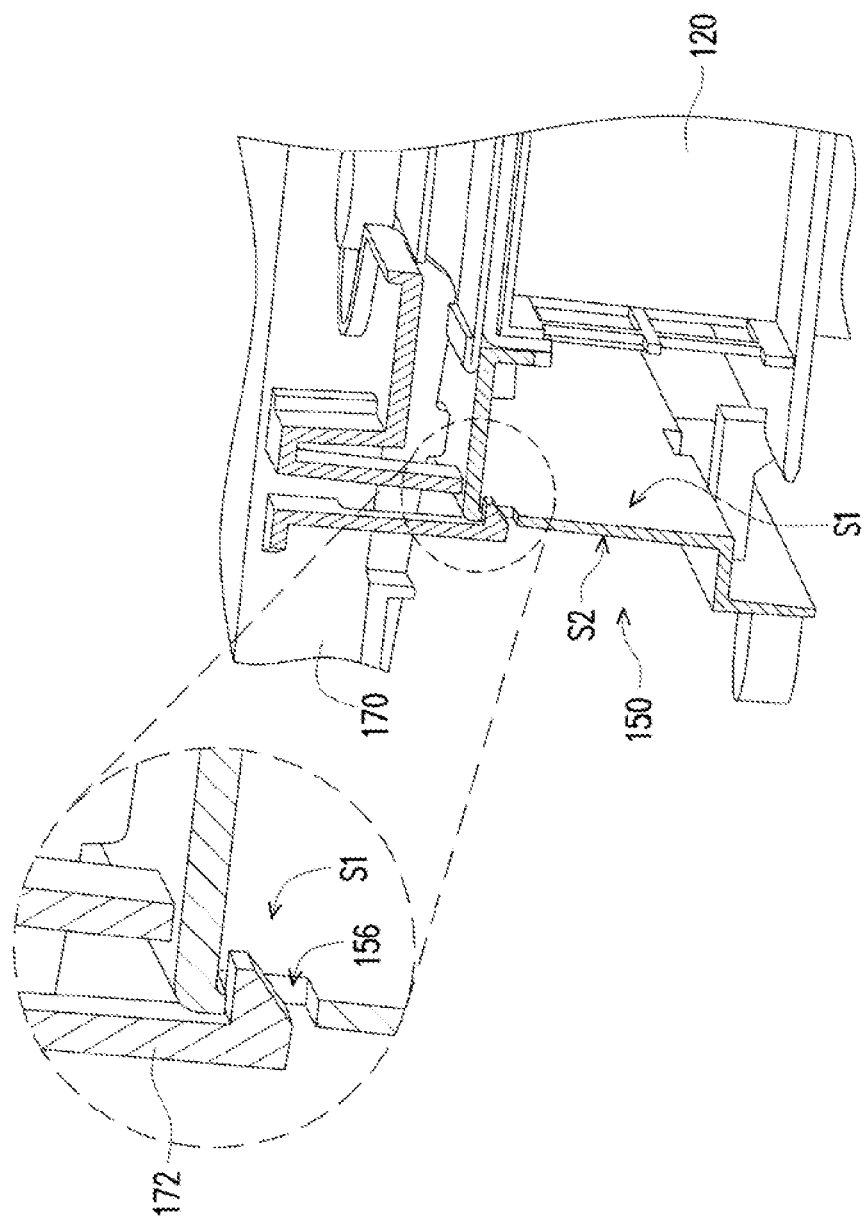
FIG. 4 is a partially-enlarged cross-sectional diagram of the power-supply wind scooper and a hard disk wind scooper shown in FIG. 1.

FIG. 4 is a partially-enlarged cross-sectional diagram of the power-supply wind scooper and a hard disk wind scooper shown in FIG. 1. Referring to FIGS. 3 and 4, particularly, in this embodiment, the hard disk wind scooper 170 has a fixing hook 172, and the power-supply wind scooper 150 has a fixing hole 156 which is located on the top part of the power-supply wind scooper 110. The location of the fixing hole 156 corresponds to that of the fixing hook 172. The fixing hole 156 penetrates to the external face S2 from the internal face S1 of the power-supply wind scooper 150. Therefore being put down to expose the hard disk opening 162 (as the process converting from the state shown in FIG. 3 to that shown in FIG. 4), the hard disk wind scooper 170 can be fixed on the power-supply wind scooper 10 by fastening the fixing hook 172 to the fixing hole 156.

It can be seen that the hard disk wind scooper 170 can be easily fixed on the power-supply wind scooper 150 without using other firing pieces. Therefore, the first airflow flowing through the heating modules 190 is prevented from flowing into the hard disk module 160 to affect the heat dissipation efficiency of the hard disk module 160. Also, the hard disk wind scooper 170 is prevented from shaking to strike other electronic parts during the process of transporting the electronic device 100. In addition the fixing hook 172 of the hard disk wind scooper 170 passes through the fixing hole 156 to reach the internal face S1 of the power-supply wind scoop 150 from the external face S2 of the power-supply wind scooper 150. Therefore, when the hard disk wind scooper 170 rotates relative to the hard disk module 160 to shield the hard disk opening 162, the fixing hook 172 can be easily moved out of the fixing hole 156. As such, the power-supply wind scooper 150 can be assembled easily.

Referring to FIG. 1 again, in this embodiment, the fan wind scooper 180 is covered on the heating modules 190, and further has partition board 180a extending from the fan module 140 to the power module 120, so that the first airflow flows through the heating modules 190 by flowing between the partition board 180a and the motherboard 110; the fourth airflow flows to the hard disk module 160 from the upper part of the partition board 180a, without flowing through the heating modules 190.

In other words, the fan wind scooper 180 divides the airflow provided by the fan module 140 into upper-layer airflow and lower-layer flow by the partition board 180a to respectively flow towards the interior of the electronic device 100. Therefore, the airflow is prevented from flowing towards another electronic module needing heat dissipation after carrying the heat generated by one of the electronic modules, which otherwise decreases the heat dissipation efficiency.

Particularly, the fan wind scooper 180 has air inlet 182 and a plurality of air outlets 184. The air inlet 182 corresponds to the fan module 140. The air outlets 184 correspond to the heating modules 190 and further face the power module 120 and the hard disk module 160. Therefore, the first airflow may flow through the heating module 190 via the air outlet 184 from the air inlet 82, and further flow towards the power module 120 and the hard disk module 160. The power-supply wind scooper 170 is used for preventing the first airflow flowing through the heating module 190 from flowing into the power module 120.

Additionally, the fan wind scooper 180 does not completely shield the fan module 140. Therefore, a part of the airflow provided by the fan module 140 enters the air inlet 182, and further flows through the heating modules 190 via the air outlets 184 to carry away the heat generated by the heating modules 190. Another part of the airflow does not flow into the air inlet 182, but directly flows out from the upper part of the partition board 180a and the gaps of the fan wind scooper 180. The two parts of the airflow without carrying the heat generated by the heating modules 190 can directly flow towards the corresponding hard disk module 160 and the corresponding power module 120, and further flow to other electronic parts for heat dissipation. Therefore, the electronic device 100 has good heat dissipation efficiency.

As described above, the present disclosure provides an electronic device. The power-supply wind scooper is arranged on the power module and shields a part of the power-supply opening. Therefore, the first airflow flowing through the heating modules is prevented from flowing into the power module; and the second airflows not flowing through the heating modules is guided to flow into the power module from a part of the power-supply opening not shielded by the power-supply wind scooper so as to decrease the temperature. In addition, the power line can be fixed on the power-supply wind scooper through the fine arrangement hook, so that the power line is prevented from interfering with the motherboard. The hard disk wind scooper can be fixed on the power-supply wind scooper by fastening the fixing hook into the fixing hole, so that the first airflow flowing through the heating modules prevented from flowing into the hard disk module. Accordingly, the electronic device has good heat dissipation efficiency. Moreover, the space configuration degree of the electronic device can be improved by virtue of the apply wind scooper with plurality of functions.

Although the present disclosure has been disclosed with reference to the above embodiments, these embodiments are not intended to limit the present disclosure. It will be apparent to those skilled in the art that various modifications can be made out departing from the scope or spirit of the present disclosure. Therefore, the scope of the present disclosure shall be defined by the appended claims.

What is claimed is:

1. An electronic device, comprising:
    a motherboard;
    a power module, being arranged on a front side of the motherboard along a longitudinal direction and having a power-supply opening;
    a hard disk module, being arranged on the front side of the motherboard along the longitudinal direction and further stacked with the power module;
    a fan module, being located on a rear side of the motherboard relative to the front side along transverse direction perpendicular to the longitudinal direction and further providing airflows towards the power-supply opening of the power module;
    a heating module, arranged on the motherboard and further located between the fan module and the power module; and
    a power-supply wind scooper, being arranged to shield a part of the power-supply opening, so that a first airflow flowing through the heating module is prevented by the power-supply wind scooper from flowing into the power module, and a second airflow not flow through the heating module flows into the power module from the part of the power-supply opening not shielded by the power-supply wind scooper.

2. The electronic device of claim 1, wherein the power-supply wind scooper comprises an air inlet, located on one side of the power-supply wind scooper and further corresponding to the part of the power-supply opening not shielded by the power-supply wind scooper, so that a third airflow not flowing through the heating module passes through the air inlet to enter the space between the power-supply wind scooper and the part of the power-supply opening shielded by the power-supply wind scooper and further passes through the part of the power-supply opening shielded by the power-supply wind scooper to flow into the power module.

3. The electronic device of claim 2, wherein the power-supply wind scooper is arranged on the motherboard and facing the power-supply opening; the air inlet is arranged to face a lateral side of the electronic device and be adjacent to the part of the power-supply opening not shielded by the power-supply wind scooper.

4. The electronic device of claim 2, wherein the power-supply wind scooper comprises stopping part, located on a second side of the power-supply wind scooper opposite to the one side of the power-supply wind scooper and being perpendicular to the transverse direction, so that the first airflow flowing through the heating module is prevented from spreading from the second side of the power-supply wind scooper.

5. The electronic device of claim 2, further comprising
    a power line connecting the motherboard and the power module, wherein the power-supply wind scooper has an internal face facing the power-supply opening and an external face facing the fan module; the power line is arranged on the external face.

6. The electronic device of 5, wherein the power-supply wind scooper comprises a line arrangement hook, located on the external face of the power-supply wind scooper, and the power line is fixed on the power-supply wind scooper by the line arrangement hook.

7. The electronic device of claim 1, further comprising a hard disk wind scooper attached to the hard disk module for preventing the first airflow flowing through the heating module from flowing into the hard disk module.

8. The electronic device of claim 1, further comprising a hard disk wind scooper, wherein the hard disk module has a hard disk opening arranged towards the fan module; the hard disk find scooper is attached to the hard disk module and is rotatable between a first position and a second position; when the hard disk wind scooper is at the first position, the hard disk wind scooper shields the hard disk opening; when the hard disk wind scooper is at the second position, the power-supply wind scooper is between the hard disk wind scooper and the motherboard so that the first airflow flowing through the heating module is prevented by the hard disk wind scooper from spreading upwardly to enter the hard disk module.

9. The electronic device of claim 8, wherein when the hard disk wind scooper is at the second position, the hard disk wind scooper exposes the hard disk opening to the fan module so that a fourth airflow not flowing through the heating module flows along a top face of the hard disk wind scooper to enter the hard disk module through hard disk opening.

10. The electronic device of claim 8, wherein when the hard disk wind scooper is at the second position the hard disk wind scooper is parallel to the motherboard.

11. The electronic device of claim 8, wherein when the hard disk wind scooper is at the second position, the hard disk wind scooper shields a part of the heating module.

12. The electronic device of claim 8, wherein the hard disk wind scooper comprises a fixing hook; the power-supply wind scooper comprises a fixing hole located on a top part of the power-supply wind scooper; and when the hard disk wind scooper is at the second position, the hard disk wind scooper is fixed onto the power-supply wind scooper by fastening the fixing hook into the fixing hole.

13. The electronic device of claim wherein the hard disk module includes a hard dish bracket and plurality of hard disks; the hard disks are arranged side by side or laminated in the hard disk bracket; and the hard disk wind scooper is arranged hard disk bracket to shield or expose the hard disk opening located on the hard disk bracket.

14. The electronic device of claim 1, further comprising:
    a fan wind scooper, wherein the fan wind scooper is covered on the heating module and further has a partition board extending to the power module from the fan module, so that the first airflow flows through the heating module by flowing between the partition board and the motherboard; a fourth airflow flows to the hard disk module by flowing above the partition board, without flowing through the heating module.

15. The electronic device of claim 14, wherein the fan wind scooper comprises an air inlet and a plurality of air outlets; the air inlet corresponds to the fan module; the heating module corresponds to one of the air outlets, so that the first airflow flows towards the power module through the heating 16. The electronic device of claim 1, further comprising a gap layer between the power module and the hard disk module, wherein the first airflow flowing through the heating module flows out of the electronic device via the gap layer.

17. The electronic device of claim 16, further comprising a hard disk wind scooper attached to the rd disk module for preventing the first airflow flowing through the heating module from flowing into the hard disk module; the first airflow flowing through the hosting module flows into the gap layer via a gap between the hard disk wind scooper and the power-supply wind scooper.

18. The electronic device of claim 1, further comprising a case, wherein the motherboard is arranged in the case; the case has a lateral wall adjacent to the wind scooper and the power module; the second airflow not flowing through the heating module flows to the art of the power-supply opening not shielded by the power-supply wind scooper along a gap between the lateral wall and the wind scooper.

* * * * *